United States Patent [19]
Hiraga

[11] Patent Number: 5,903,184
[45] Date of Patent: May 11, 1999

[54] SEMICONDUCTOR DEVICE HAVING PROTECTION CIRCUIT

[75] Inventor: Noriaki Hiraga, Kyoto, Japan

[73] Assignee: Rohm Co., Ltd., Kyoto, Japan

[21] Appl. No.: 08/768,889

[22] Filed: Dec. 17, 1996

[30] Foreign Application Priority Data

Dec. 19, 1995 [JP] Japan .................................... 7-330818
Apr. 25, 1996 [JP] Japan .................................... 8-105728

[51] Int. Cl.⁶ ........................................................ G05F 1/10
[52] U.S. Cl. .............................................. 327/546; 361/91
[58] Field of Search ..................................... 327/309, 313, 327/314, 321, 333, 530, 538, 540, 541, 543, 545, 546, 310, 325–328; 361/90–92, 56, 111, 225

[56] References Cited

U.S. PATENT DOCUMENTS

| 4,858,055 | 8/1989 | Okitaka .................................... 327/313 |
| 5,477,414 | 12/1995 | Li et al. .................................... 361/56 |
| 5,617,283 | 4/1997 | Krakauer et al. ........................... 361/56 |

OTHER PUBLICATIONS

An excerpt from a book "Physics of VLSI Devices" (co-authored by Kishino and Koyanagi) published on Jul. 25, 19986 by Maruzen Co., Ltd., Chapter 4 "Bipolar Devices", Section 6 Various Phenomena Observed in Bipolar Devices (pp. 230–233) (together with a copy of its translation).

*Primary Examiner*—My-Trang Nu Ton
*Attorney, Agent, or Firm*—Nikaido, Marmelstein, Murray & Oram, LLP

[57] ABSTRACT

A semiconductor device is provided with a protection circuit, between a terminal and an input/output circuit of the semiconductor device, that protects the input/output circuit and an internal circuit of the semiconductor device against application of a high voltage due to static electricity. Protection is achieved by short-circuiting the terminal via a resistor with a power source voltage line or a reference potential line when a voltage exceeding a predetermined value is applied to the terminal. The semiconductor device is further provided with an across-power-source protection circuit, close to the protection circuit, that short-circuits the power source voltage line with the reference potential line when a difference in potential between the power source voltage line and the reference potential line falls outside a predetermined range, so that partial potential variations in the power source voltage line or reference potential line, which arise from wiring resistances when either of these lines is short-circuited to the terminal by the protection circuit, are suppressed.

12 Claims, 3 Drawing Sheets

SEMICONDUCTOR DEVICE HAVING PROTECTION CIRCUIT

BACKGROUND OF THE INVENTION

1. Field of the Invention

The present invention relates to a semiconductor device, particularly to a semiconductor device that is provided with a protection circuit so as to be protected from destruction due to application of a high voltage such as static electricity.

2. Description of the Prior Art

When a semiconductor device is brought into contact, for example, with a person or machine that is charged with static electricity having a voltage from tens of volts to tens of kilovolts resulting from friction or other, the electrostatic charge is discharged through the semiconductor device via its terminals and internal circuit in a time as short as several nanoseconds to several microseconds. This often causes the so-called electrostatic destruction, by which the internal elements of the semiconductor device are destroyed, or its functions and characteristics are degraded. Especially, in a CMOS, bi-MOS, or similar type of semiconductor device containing field-effect transistors as its circuit elements, the gate oxide films have relatively low breakdown voltages, and accordingly are easily destroyed by application of an extremely high voltage. For this reason, a semiconductor device is usually provided, at each of its input and output portions, with a protection circuit that protects the semiconductor device from destruction by directing the current arising from a high electrostatic voltage to a low-impedance line such as a power source voltage line ($V_{DD}$) or reference potential line (GND).

FIG. 1 shows a conventional semiconductor device 10a. This semiconductor device 10a consists of an input/output portion 1a connected to a terminal T1, and an internal circuit 3 that performs signal processing or other. The input/output portion 1a consists of an input/output circuit 2 for buffering a signal between the terminal T1 and the internal circuit 3, and a protection circuit 4a for preventing an excessively high voltage applied to the terminal T1 from reaching the input/output circuit 2 or internal circuit 3. The protection circuit 4a consists of resistors 11 and 14 connected in series between the terminal T1 and the input/output circuit 2, and diodes 12 and 13 connected in the reverse-biased state from the node between the resistors 11 and 14 to the power source voltage line and to the reference potential line, respectively.

The protection circuit operates as follows. Assume that the power source voltage is $V_H$ (V), the reference potential is $V_L$ (V), and the forward voltage of each diode is $V_F$ (V). When a voltage, due to static electricity or other, exceeding ($V_H+V_F$) is applied to the terminal T1, the resulting current flows through the resistor 11 and the diode 12 along the path indicated by the broken line I1. Therefore, theoretically, the voltage is lowered from the applied voltage by the register 11, and only the remaining portion, i.e. ($V_H+V_F$), is applied to the input/output circuit 2 and the internal circuit 3, which are thus protected from destruction due to application of a high voltage. Similarly, when a negative voltage lower than ($V_L-V_F$) is applied to the terminal T1, the resulting current flows through the resistor 11 and the diode 13 along the path indicated by the broken line I2. Therefore, theoretically, the voltage is lowered from the applied voltage by the resistor 11, and only the remaining portion, i.e. ($V_L-V_F$), is applied to the input/output circuit 2 and the internal circuit 3, which are thus protected from destruction due to application of a high voltage.

However, such a current that flows in through the diodes may cause variations in the voltages of the power source voltage line and the reference potential line. This is because the power lines such as these lines possess various resistances, for example, the resistance of the wiring itself that is formed of aluminum or other metal and the resistance of the contacts between the wiring and the circuit elements.

Especially, when the input/output portion 1a is located away from the power source voltage line and the reference potential line of the semiconductor device, the wiring resistance of the power lines is accordingly greater. For this reason, even if the current is passed only through either the power source voltage line or reference potential line, it is impossible to sufficiently suppress the variations in the voltages of the power lines. As a result, it often happens that the voltage of the power source voltage line becomes higher than ($V_H+V_F$) or the voltage of the reference potential line becomes lower than ($V_L-V_F$).

Moreover, in a semiconductor device formed under common manufacturing conditions, the reverse-biased diodes used in the protection circuit and the input gates such as are used in the inverter circuit 2a generally do not have very high breakdown voltages. For this reason, these elements are easily destroyed by application of a high voltage, and, in addition, the diodes are susceptible to thermal breakdown due to a flow of a large current. As a result, when the voltage between the power lines becomes higher than the breakdown voltage of the input/output circuit 1a or internal circuit 3 as a consequence of the voltage variations as described above, it often happens that the circuit elements of the semiconductor device are destroyed, and thus the semiconductor device fails to provide intended functions.

Therefore, in order to protect the semiconductor device from destruction due to the variations in the voltages of the power lines as a consequence of a current resulting from static electricity or other applied to the terminal T1, it is necessary that the resistor 11 have as high a resistance as possible, e.g. over several hundreds of ohms, and that the wiring width for the resistor 11 be widened to allow more current to flow through the resistor 11, so that a sufficient voltage drop and a current-limiting effect are achieved there Moreover, to accomplish securer protection, it is also advisable that the resistor 14 have as high a resistance as possible. This resistor 14 forms an integrator circuit together with the parasitic capacitance of the input/output circuit 2. However, higher resistances in these resistors lead not only to larger time constants, which makes transmission of high-speed input signals difficult, but also to larger chip sizes and higher costs of the semiconductor device.

Furthermore, even static electricity applied from outside a portable electronic appliance may cause destruction of the input/output portion 1a or internal circuit 3 of the semiconductor device 10a mounted on a circuit board inside the appliance, leading to failure of the appliance as a whole, if the semiconductor device 10a is not given a sufficiently high breakdown voltage. In such a case, troubleshooting and remounting of the semiconductor device usually require much time and costs.

Moreover, in a conventional semiconductor device 10a, when the terminal T1 is connected to a bus line or the like connecting to another semiconductor device (not shown in the figure) to which the power source voltage is applied, even if the power source voltage is not applied to the semiconductor device 10a itself, a voltage lower than the input voltage by the forward voltage of the diode 12 is applied through the diode 12 to the power source voltage line of the device 10a. This results in unnecessary power dissipation in the semiconductor device 10a and makes its operation unstable, thereby affecting other semiconductor devices adversely via the bus line or the like.

This problem may be solved by removing the diode 12. However, simply removing the diode 12 results in the loss of the protection capability against electrostatic destruction. Thus, when an excessively high voltage due to static electricity or other is applied to the semiconductor device 10a, its circuits elements may be destroyed and cause faulty operation.

SUMMARY OF THE INVENTION

An object of the present invention is to provide a semiconductor device that has an improved breakdown voltage as protection against a high voltage applied to its terminal as a result of static electricity or other, and that is capable of transmitting high-speed signals. Another object of the present invention is to provide a semiconductor device that can be easily connected to a bus line or the like provided for data communication among semiconductor devices.

To achieve the above objects, according to the present invention, in a semiconductor device provided with an input/output portion having an input or output terminal and with an internal circuit that communicates a signal with the input/output portion to process the signal, between a power source voltage line and a reference potential line of the input/output portion is provided an across-power-source protection circuit that performs a switching operation to conduct between the power source voltage line and the reference potential line when a voltage between these lines exceeds a predetermined voltage and that is otherwise kept in a non-conducting state, so that a voltage exceeding the predetermined voltage is prevented from being applied to the internal circuit of the semiconductor device.

Alternatively, according to the present invention, in a semiconductor device provided with an input/output circuit to whose terminal a signal having a voltage higher than a voltage of a power source voltage line can be applied, a protection circuit is provided that has a first diode connected between the terminal and a reference potential line, with the anode of the first diode directed to the reference potential line, and an npn-type transistor and a second diode connected in series between the terminal and the power source voltage line, with the base of the transistor connected to its emitter through a resister, with the collector of the transistor directed to the terminal, and with the cathode of the second diode directed to the power source voltage line, so that, when a voltage higher than a punch-through voltage of the transistor is applied to the terminal, a current resulting from the voltage is directed to the power source voltage line in order to lower the voltage applied to the input/output circuit.

BRIEF DESCRIPTION OF THE DRAWINGS

This and other objects and features of this invention will become clear from the following description, taken in conjunction with the preferred embodiments with reference to the accompanied drawings in which.

DESCRIPTION OF THE PREFERRED EMBODIMENTS

Figure 1:
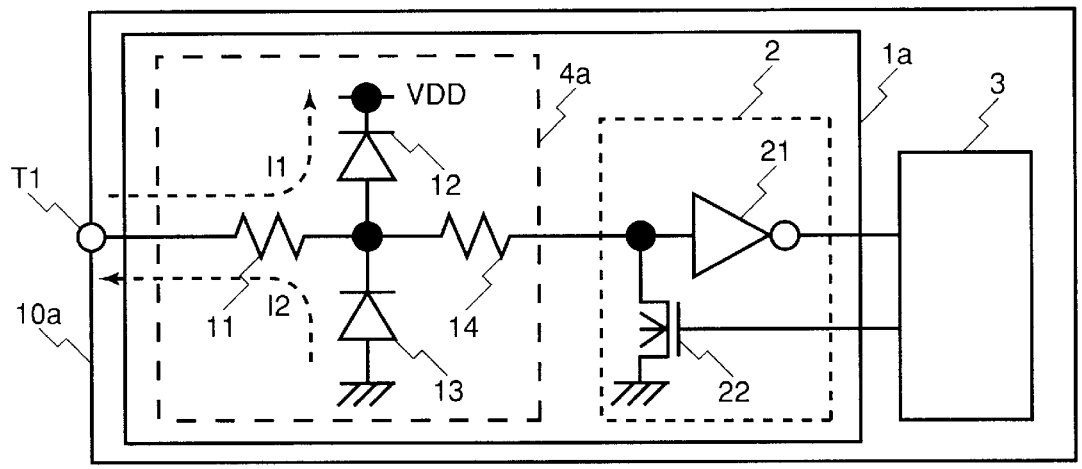
FIG. 1 is a diagram showing the circuit construction of a conventional semiconductor device provided with a protection circuit.
Figure 2:
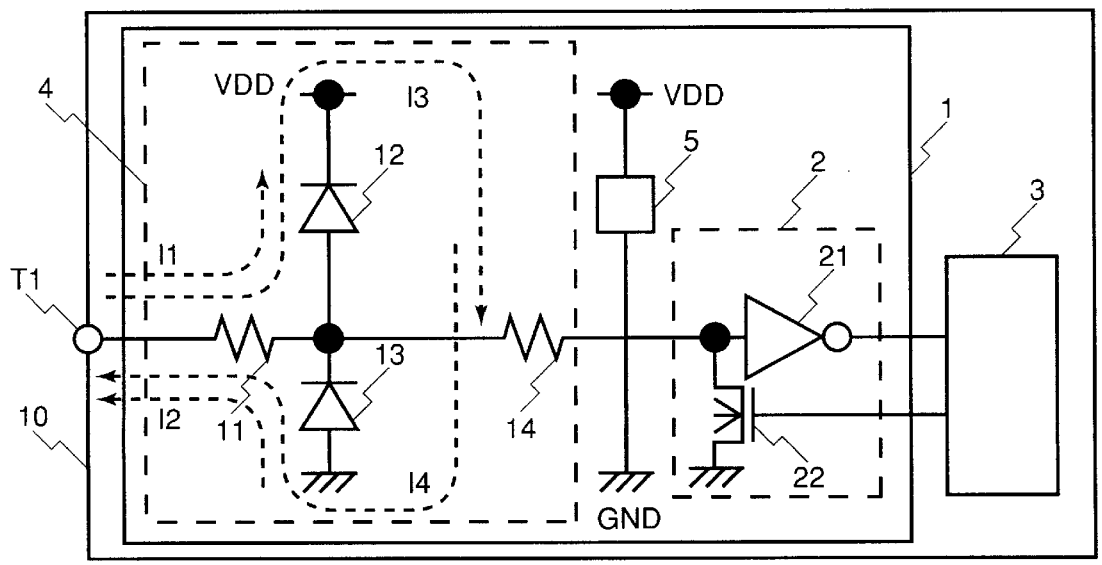
FIG. 2 is a diagram showing the circuit construction of a first embodiment of the semiconductor device of the present invention.

Hereinafter, the semiconductor device of the present invention will be described in detail with reference to the drawings. Note that, in order to omit duplicate explanations, the same or similar circuit elements will be referred to with the same designation throughout all the drawings in the present specification. Moreover, in the following descriptions, the voltage of the power source voltage line ($V_{DD}$) is represented by $V_H$ (V), the voltage of the reference potential line (GND) is represented by $V_L$ (V), and the forward voltage of the diodes in protection circuits is represented by $V_F$ (V). Furthermore, the power source voltage line and the reference potential line are collectively referred to as the "power lines", FIG. 2 shows the circuit construction of the semiconductor device 10 of a first embodiment of the present invention. The semiconductor device 10 consists of a terminal T1 serving as an input or output terminal, an input/output portion 1 that is connected to a bus line or the like connecting to other semiconductor devices (not shown in the figure) so as to communicate signals with the other semiconductor devices, and an internal circuit 3 for performing signal processing or other on a received signal. The input/output portion 1 consists of an input/output circuit 2 for buffering a signal between the terminal T1 and the internal circuit 3, a protection circuit 4 for protecting the input/output circuit 2 and the internal circuit 3 from destruction when an abnormally high voltage is applied to the terminal T1, and an across-power-source protection circuit 5 connected between the power lines of the input/output portion 1.

The across-power-source protection circuit 5 conducts, when the difference in potential between the power source voltage line and the reference potential line falls outside a predetermined range, in order to allow a current to flow for a short while from the power source voltage line to the reference potential line or vise versa The across-power source protection circuit 5 will be described in more detail later.

The protection circuit 4 consists of resistors 11 and 14 connected in series between the terminal T1 and the input/output circuit 2, and diodes 12 and 13 connected from the node between the resistors 11 and 14 to the power source voltage line and to the reference potential line, respectively. The diode 12 has its cathode connected to the power source voltage line, and the diode 13 has its anode connected to the reference potential line. That is, the two diodes are each connected in the reverse-biased state.

The resistors 11 and 14 are formed of polysilicon so as not to form parasitic diodes with respect to the power source voltage line, and have resistances of tens of ohms to hundreds of ohms, and over hundreds of ohms, respectively. The resistor 11 is formed wider than the resistor 14 so as to allow more current to flow through the former than through the latter.

The input/output circuit 2 consists of an inverter circuit 21 including a CMOS inverter for supplying a signal from the terminal T1 to the internal circuit 3, and an n-channel MOS transistor 22 connected with its drain open for delivering a signal from the internal circuit 3 to outside via the terminal T1.

Usually, a plurality of input/output portions 1 are arranged near the periphery of the semiconductor chip, and the protection circuit 4 is located as close as possible to the terminal T1 to obtain the best protection capability. Note that, in FIG. 2, only one input/output portion 1 that is connected to the terminal T1 is shown to simplify the explanations.

The operation of the semiconductor device 10 will be described below. First, under the normal operating condition where a signal within the rated power source voltage range is inputted to or outputted from the terminal T1, the semiconductor device operates as follows In the signal input state, the output transistor 22 is put into the non-conducting (OFF) state, and a signal within the rated power source voltage range from a separate circuit (not shown in the figure) is received via the terminal T1, so that the inputted signal is supplied through the inverter 21 to the internal circuit 3. In the signal output state, the transistor 22 is switched between the conducting and non-conducting states in accordance with the output signal from the internal circuit 3, so that the signal is outputted via the terminal T1. Thus, under the normal operating condition, where only voltages within the rated voltage range are inputted to or outputted from the terminal T1, no current flows through the diodes 12 and 13 or through the across-power-source protection circuit 5.

By contrast, when a high voltage such as static electricity is applied to the terminal T1, the semiconductor device operates as follows. When a voltage higher than $(V_H+V_F)$ is applied to the terminal T1, it causes a current to flow along the path indicated by the broken line I1. When a still higher voltage is applied and, as a result, the voltage of the power source voltage line rises partially, it not only causes a current to flow along the path indicated by the broken line I1 but also causes the across-power-source protection circuit 5 to conduct so as to allow another current to flow along the path indicated by the broken line I3 to the reference potential line. Similarly, when a negative voltage whose absolute value is higher than $(V_L-V_F)$ is applied to the terminal T1, it causes a current to flow along the path indicated by the broken line I2. When a still higher voltage is applied and, as a result, the voltage of the reference potential line drops partially, it not only causes a current flow along the path indicated by broken line I2 but also causes the across-power-source protection circuit 5 to conduct so as to allow another current to flow along the path indicated by the broken line I4 to the power source voltage line.

Moreover, when application of a high voltage due to static electricity or other causes a large current to flow through the reference potential line of the input/output portion 1 and, as a result, the voltage of the reference potential line partially exceeds the voltage predetermined in the across-power-source protection circuit 5, the across-power-source protection circuit 5 allows a current to flow through itself from the reference potential line to the power source voltage line.

Owing to the above described operation, when an abnormally high voltage due to statistic electricity or other is applied to the terminal T1, the across-power-source protection circuit 5 starts to conduct, because it is set to conduct at a predetermined voltage. This makes it possible to direct currents resulting from abnormal voltages to the power lines. As a result, it is possible to reduce variations in the voltage between the power lines as compared with a conventional semiconductor device, and thus to protect more securely the input/output circuit 2 or internal circuit 3 from destruction by such voltage variations. Moreover, this improved protection capability makes it possible to achieve conventionally common degrees of protection capability with a lower resistance in the resistor 11, and thus allows signals to be dealt with at higher rates.

The following modifications are possible. The drain of the transistor 22 may be connected to the terminal T1 side of the resistor 11 for the purpose of lowering the output impedance. When the terminal T1 is used solely for output, the resisters 11 and 14 may have as low resistances as possible, or may be totally omitted. As the diodes 12 and 13 may be used the diodes that are formed parasitically by the output transistor 22. The input/output circuit 2 may be provided not in the input/output portion 1 but in the internal circuit 3, or may be provided separately between the input/output portion 1 and the internal circuit 3; an input/output circuit 2 of any construction can be placed and at any location.

Figure 3:
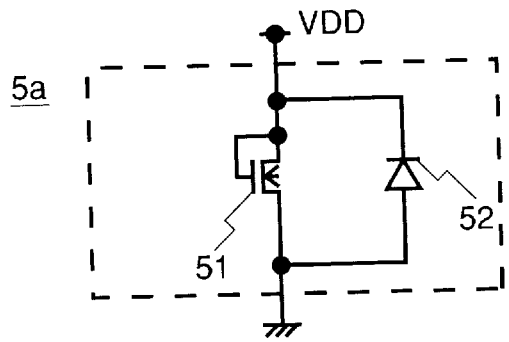
FIG. 3 is a diagram showing a construction of the across-power-source protection circuit of the present invention.

FIG. 3 shows a practical example of the across-power-source protection circuit 5 shown in FIG. 2. This across-power-source protection circuit 5a consists of an n-channel MOS transistor 51 with its drain and gate connected to the power source voltage and its source connected to the reference potential, and a diode 52 with its cathode connected to the power source voltage and its anode connected to the reference potential.

The transistor 51 is not such a transistor that has a gate oxide film several hundred angstrom thick as is used in the internal circuit 3, but a transistor that has as its gate oxide film a field oxide film several thousand to ten to twenty thousand angstrom thick formed for the separation and protection of the element. Moreover, this transistor 51 has its channel between the source and drain formed longer, to several microns long, as compared with such transistors as are mainly used in the internal circuit 3, so that the transistor 51 has a threshold voltage of 10 to 20 volts.

Owing to the above construction, when a current flowing along the path indicated by the broken line I1 in FIG. 2 partially raises the voltage of the power source voltage line of the input/output portion 1, or when a current flowing along the path indicated by the broken line I2 in the same figure partially lowers the voltage of the reference potential line of the input/output portion 1, in either case causing the voltage between the power source voltage line and the reference potential line to become higher than the threshold voltage of the transistor 51, the transistor 51 conducts and allows a current to flow from the power source voltage line to the reference potential line. Moreover, when the voltage of the reference potential line becomes partially higher than $(V_H+V_F)$, a current flows through the diode 52 from the reference potential line to the power source voltage line.

Figure 4:
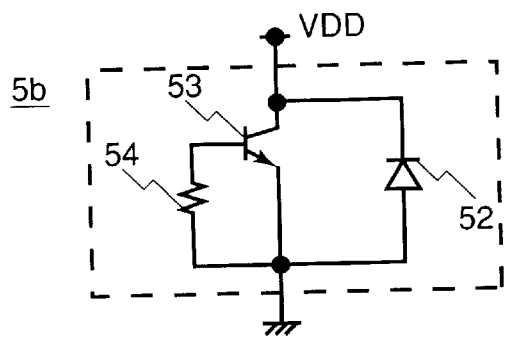
FIG. 4 is a diagram showing another construction of the across-power-source protection circuit of the present invention.

FIG. 4 shows another practical example of the across-power-source protection circuit 5 shown in FIG. 2. This across-power-source protection circuit 5b uses, instead of a MOS transistor 51 used in the across-power-source protection circuit 5a shown in FIG. 3, an npn-type transistor 53 whose punch-through voltage is set to ten to twelve volts so as to be higher than the power source voltage. The transistor 53 has its emitter connected to the reference potential, its base connected through a resistor 54 to the reference potential, and its collector connected to the power source voltage. The across-power-source protection circuit 5b of this construction operates in the same way as the circuit 5a shown in FIG. 3, but it uses, as a reference voltage for conduction, the punch-through voltage of the transistor 53 instead of the threshold voltage of the MOS transistor 51.

Figure 5:
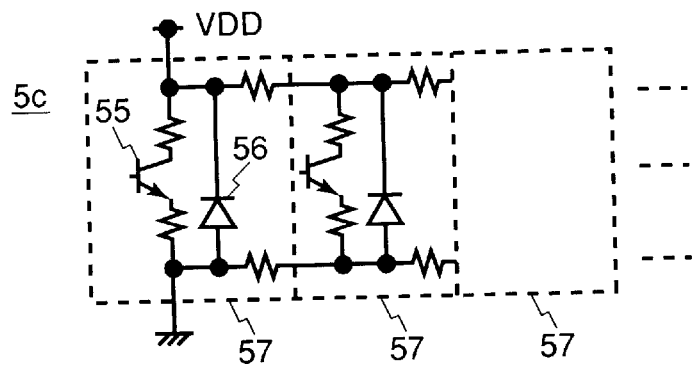
FIG. 5 is a diagram showing still another construction of the across-power-source protection circuit of the present invention.

FIG. 5 shows still another practical example of the across-power-source protection circuit 5. This across-power-source protection circuit 5c consists of a plurality of across-power-source protection circuits 57 connected in a distributed-constant-like manner. Each of these across-power-source protection circuits 57 consists of an npn-type transistor 55 with its collector connected to the power source voltage line, its emitter connected to the reference potential line, and its base left unconnected, and a diode 56 with its cathode connected to the power source voltage line and its anode connected to the reference potential line. Here, the transistor 55 is so formed as to have a punch-through voltage of 10 to 20 volts.

The resistors shown in FIG. 5 represent parasitic resistances such as wiring and contact resistances. Although the transistor 55 has, at its base, parasitic capacitances including the junction capacitance, this dose not affect the normal operation, because such capacitances are too small to cause the transistor 55 to be kept conducting for a long time by noise. The base of the transistor 55 may be connected through a resistor to the reference potential line.

In the across-power-source protection circuit 5c of the above construction, when a current flowing along the path indicated by the broken line I1 in FIG. 2 partially raises the voltage of the power source voltage line of the input/output portion 1, or when a current flowing along the path indicated by the broken line I2 in the same figure partially lowers the voltage of the reference potential line of the input/output portion 1, in either case causing the voltage between the power source voltage line and the reference potential line to become higher than the punch-through voltage of the transistor 55, the transistor 55 conducts and allows a current to flow from the power source voltage line to the reference potential line. Moreover, when the voltage of the reference potential line becomes partially higher than the power source voltage, a current flows through the diode 56 from the reference potential line to the power source voltage line.

Figure 6:
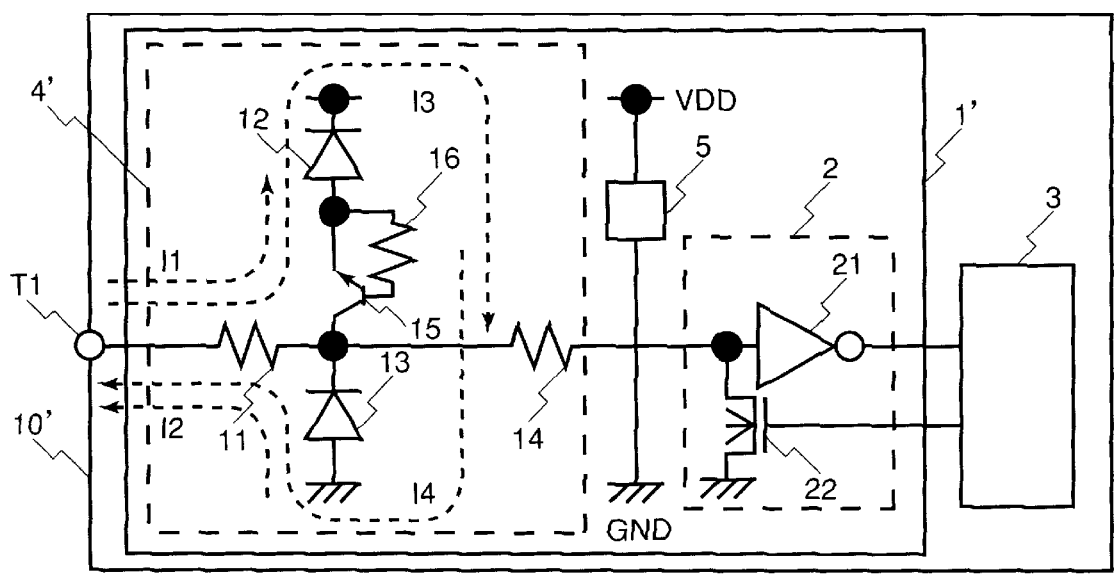
FIG. 6 is a diagram showing the circuit construction of a second embodiment of the semiconductor device of the present invention.

A second embodiment of the semiconductor device will be described. FIG. 6 shows the circuit construction of the semiconductor device 10' of this embodiment. The semiconductor device 10' consists of a terminal T1, an internal circuit 3, and an input/output portion 1'. The input/output portion 1' consists of an input/output circuit 2, a protection circuit 4', and an across-power-source protection circuit 5. All these circuits are the same as the corresponding circuits of the semiconductor device 10 of the first embodiment except the protection circuit 4'.

The protection circuit 4' of this semiconductor device 10' is constructed by adding another transistor 15 to the protection circuit 4 of the semiconductor device 10. Here, the node between the resistors 11 and 14 is connected to the power source voltage line through the transistor 15 and the diode 12 connected in series. The transistor 15 has its collector connected to the node between the resistors 11 and 14, and its base is connected through a resistor 16 to its emitter. The emitter of the transistor 15 is connected to the anode of the diode 12, so that it is connected through the diode 12 to the power source voltage line. The punch-through voltage $V_{PT}$ of the transistor 15 is set to several volts to 10 to 20 volts so as to be higher than the power source voltage $V_H$. The transistor 15 and the diode 12 may be connected in the reverse order.

As the across-power-source protection circuit 5, any of the circuits 5a, 5b, and 5c shown in FIGS. 3 to 5 can be used.

The operation of the semiconductor device 10' will be described below. First, under the normal operating condition where a constant power source voltage $V_H$ is applied to the semiconductor device 10' and a signal having a voltage within $(V_H + V_{PT} + V_F)$ is input to or output from the terminal T1, the semiconductor device 10' operates as follows. In the signal input state, the output transistor 22 is put into the non-conducting (OFF) state, and a signal from a separate circuit (not shown in the figure) is received via the terminal T1, so that the input signal is supplied through the inverter 21 to the internal circuit 3. During this time, the transistor 15 is kept in the non-conducting state, and therefore no current flows into the power source voltage line. In the signal output state, the transistor 22 is switched between the conducting and non-conducting states in accordance with the output signal from the internal circuit 3, so that a bus line or the like connected to the terminal T1 is switched between the high and low levels, thereby communicating the output signal.

Also under the non-operating condition where the power source voltage is not applied to the semiconductor device 10' but a signal having a voltage within $(V_H + V_{PT} + V_F)$ is input to or output from the terminal T1, the transistor 15 of the protection circuit 4' does not conduct. As a result, no current flows through the diode 12 to the power source voltage line, and therefore it does not happen that the semiconductor device 10' is supplied with the power source voltage and starts operating.

By contrast, when a high voltage due to static electricity or other is applied to the terminal T1, the semiconductor device 10' operates as follows. When a voltage higher than $(V_H + V_{PT} + V_F)$ or $(V_H + V_{PT})$ is applied to the terminal T1, the transistor 15 develops punch-through, thereby causing a current to flow along the path indicated by the broken line I1, so that the voltage is lowered from the applied voltage by the resistor 11. Therefore, theoretically, the voltage actually applied to the input/output circuit 2 and the internal circuit 3 of the semiconductor 10' is reduced to $(V_H + V_{PT} + V_F)$. Similarly, when a negative voltage whose absolute value exceeds $(V_L - V_F)$ is applied to the terminal T1, it causes a current to flow along the path indicated by the broken line I2, so that the voltage is lowered from the applied voltage by the resistor 11. Therefore, theoretically, the voltage actually applied to the input/output circuit 2 and the internal circuit 3 is reduced to $(V_L - V_F)$.

Owing to the above described operation, under the normal operating condition or non-operating condition, even if an input signal having a voltage higher than the power source voltage applied to the semiconductor device 10' is applied to the terminal 1, no current flows in the semiconductor device 10' and thus no power is dissipated unnecessarily. As a result, even if the terminal T1 is connected to a bus line provided for data communication among semiconductor devices, the semiconductor device 10' never affects other devices adversely via the bus line. Moreover, even if such an abnormally high voltage that causes punch through in the transistor 15 is applied, the resulting current is made to flow through the protection circuit 4', so that the input/output circuit 2 and the internal circuit 3 are protected from destruction.

When a current flowing along the path indicated by the broken line I1 causes the voltage of the power source voltage line to rise partially, the across-power-source protection circuit 5 conducts and thereby allows the current to flow along the path indicated by the broken line I3. Thus, the rise in the voltage is instantly suppressed. Similarly, when a current flowing along the path indicated by the broken line I2 causes the voltage of the reference potential line to drop partially, the across-power-source protection circuit 5 conducts and thereby allows the current to flow along the path indicated by the broken line I4. Thus, the drop in the voltage is instantly suppressed. In this way, voltage variations in the power lines as the result of the operation of the protection circuit 4' are suppressed by the across-power-source protection circuit 5. This not only allows the semiconductor device 10' to operate stably all the time, but also prevents it from affecting other devices connected to the same power source voltage line or reference potential line, thus allowing the other devices to operate stably.

The semiconductor device of the present invention is not limited to the constructions of the two embodiments described above. For example, more than one type of the across-power-source protection circuits 5a, 5b, and 5c shown in FIGS. 3 to 5 may be formed together in a single input/output portion, or in any of a plurality of input/output portions. Furthermore, although only one input/output portion 1 is shown in FIG. 2 or 6, in a practical semiconductor device, where a plurality of input/output portions 1 and a plurality of terminals T1 are usually formed around the chip, it is also possible to arrange the across-power-source protection circuit 5a or 5b of FIG. 3 or 4 so that one such circuit is connected to each of the plurality of terminals, or to provide the across-power-source protection circuit 57 of FIG. 5 for each terminal.

Moreover, instead of the diode 52 shown in FIGS. 3 and 4 or the diode 56 shown in FIG. 5, the diodes that are formed parasitically when the elements are formed may be used to achieve the same effect, or, in the across-power-source protection circuit 5c of FIG. 5, instead of the forward voltage of the diode 56, the reverse punch-through voltage of the transistor 55 may be used. Furthermore, a diode may be added to the terminal T1 side of the resistor 11, or the resistor 11 may be formed as a diffused resistor so that diodes are formed in a distributed-constant-like manner, or any diode may be omitted in accordance with the output form. These modifications to the semiconductor device do not affect in any way the operation of the across-power-source protection circuit 5a, 5b, or 5c of the present invention.

What is claimed is:

1. A semiconductor device comprising:
   an input/output portion having an input or output terminal;
   an internal circuit that communicates a signal with said input/output portion to process the signal;
   a protection circuit for protecting the input/output portion and said internal circuit; and
   an across-power-source protection circuit provided between a power source voltage line and a reference potential line of said input/output portion, said across-power-source protection circuit including a diode having an anode directly connected to said reference potential line and a cathode connected to said power source voltage, said across-power-source protection circuit performs a switching operation to conduct between said power source voltage line and said reference potential line when a voltage between these lines exceeds a predetermined voltage and that is otherwise kept in a non-conducting state, so that a voltage exceeding the predetermined voltage is prevented from being applied to said internal circuit of the semiconductor device.

2. A semiconductor device as claimed in claim 1, wherein said across-power-source protection circuit comprises a field-effect transistor formed using a field oxide film as its gate oxide film, so that said predetermined voltage is equal to a threshold voltage of said field effect transistor.

3. A semiconductor device as claimed in claim 1, wherein said across-power-source protection circuit comprises a transistor with its base left unconnected, so that said predetermined voltage is equal to a punch-through voltage of said transistor.

4. A semiconductor device comprising:
   an input/output circuit to whose terminal a signal having a voltage higher than a voltage of a power source voltage line can be applied, and
   a protection circuit is provided that has a) a first diode connected between said terminal and a reference potential line, with an anode of said first diode connected to the reference potential line, and b) an npn-type transistor and a second diode connected serially between said terminal and the power source voltage line, wherein a base of said transistor being connected to its emitter through a resistor,
   a collector of said transistor connected to said terminal, and
   a cathode of said second diode connected to the power source voltage line, so that, when a voltage higher than a punch-through voltage of said transistor is applied to said terminal, a current resulting from said voltage is directed to the power source voltage line in order to lower the voltage applied to said input/output circuit.

5. A semiconductor device as claimed in claim 4, wherein, close to said terminal, between the reference potential line and the power source voltage line is provided an across-power-source protection circuit for suppressing voltage variations in the power source voltage line due to a current flowing through said protection circuit.

6. A semiconductor device as claimed in claim 5, wherein said across-power-source protection circuit includes a diode having a cathode connected to the power source voltage and an anode connected to the reference potential line.

7. A semiconductor device comprising:
   a first wire set to a first potential,
   a second wire set to a second potential that is lower than said first potential,
   a terminal connected to a signal line whose potential varies between said first and second potentials,
   a first switching circuit that connects said terminal to said first wire when a voltage higher than a predetermined potential above said first potential is applied to said terminal, said first switching circuit including a diode and a transistor serially connected between said terminal and said first wire and a base of said transistor is connected to its emitter through a resistor,
   a second switching circuit that connects said terminal to said second wire when a voltage lower than a predetermined potential below said second potential is applied to said terminal, and
   a third switching circuit that connects said first wire to said second wire when a difference in potential between said first and second wires falls outside a predetermined range.

8. A semiconductor device as claimed in claim 7, wherein said third switching circuit includes a transistor that allows a current to pass from said first wire to said second wire but allows no current to pass from said second wire to said first wire.

9. A semiconductor device as claimed in claim 7, wherein said third switching circuit includes a diode that allows a current to pass from said second wire to said first wire but allows no current to pass from said first wire to said second wire.

10. A semiconductor device as claimed in claim 7, wherein said third switching circuit includes a transistor that allows a current to pass from said first wire to said second wire but allows no current to pass from said second wire to said first wire and a diode that allows a current to pass from said second wire to said first wire but allows no current to pass from said first wire to said second wire.

11. A semiconductor device as claimed in claim 7, wherein said transistor of said first switching circuit allows a current to pass from said terminal to said first wire but allows no current to pass from said first wire to said terminal.

12. A semiconductor device as claimed in claim 7, wherein said third switching circuit includes a diode having a cathode connected to said first wire and an anode connected to said second wire.

\* \* \* \* \*